(12) United States Patent
Lin et al.

(10) Patent No.: US 8,778,738 B1
(45) Date of Patent: Jul. 15, 2014

(54) PACKAGED SEMICONDUCTOR DEVICES AND PACKAGING DEVICES AND METHODS

(71) Applicant: Taiwan Semiconductor Manfacturing Company, Ltd., Hsin-Chu (TW)

(72) Inventors: Jing-Cheng Lin, Hsin-Chu (TW); Po-Hao Tsai, Zhongli (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/770,909

(22) Filed: Feb. 19, 2013

(51) Int. Cl.
*H01L 21/00* (2006.01)

(52) U.S. Cl.
USPC ............ 438/118; 257/777; 257/778; 257/738

(58) Field of Classification Search
CPC ........... H01L 2224/48091; H01L 2224/32225; H01L 2224/16225; H01L 2224/73204; H01L 2224/15311; H01L 2224/06541
USPC ................... 257/777, 778, 737, 738; 438/118
See application file for complete search history.

(56) References Cited

U.S. PATENT DOCUMENTS

| | | | |
|---|---|---|---|
| 5,841,193 A | | 11/1998 | Eichelberger |
| 6,462,414 B1* | | 10/2002 | Anderson ...................... 257/738 |
| 7,084,513 B2 | | 8/2006 | Matsuki et al. |
| 2009/0014858 A1 | | 1/2009 | Boon et al. |
| 2010/0133704 A1 | | 6/2010 | Marimuthu et al. |
| 2011/0068427 A1 | | 3/2011 | Paek et al. |
| 2011/0147906 A1 | | 6/2011 | Yang et al. |
| 2011/0215464 A1* | | 9/2011 | Guzek et al. .................. 257/737 |
| 2011/0285007 A1 | | 11/2011 | Chi et al. |
| 2012/0181673 A1 | | 7/2012 | Pagaila et al. |
| 2013/0210198 A1* | | 8/2013 | Lin ............................... 438/126 |
| 2013/0292828 A1* | | 11/2013 | Kwon et al. ................... 257/737 |

OTHER PUBLICATIONS

Kumar, A., et al., "Wafer Level Embedding Technology for 3D Wafer Level Embedded Package," 59th Electronic Components and Technology Conference (ECTC 2009). May 26-29, 2009, pp. 1289-1296. doi: 10.1109/ECTC.2009.5074177.

Li, Z., et al., "Design, Processing and Reliability Characterizations of a 3D-WLCSP Packaged Component," 59th Electronic Components and Technology Conference (ECTC 2009). May 26-29, 2009, pp. 972-979. doi: 10.1109/ ECTC.2009.5074131.

Motohashi, N., et al., "SMAFTI Package with Planarized Multilayer Interconnects," 59th Electronic Components and Technology Conference (ECTC 2009). May 26-29, 2009, pp. 599-606. doi: 10.1109/ECTC.2009.5074074.

\* cited by examiner

*Primary Examiner* — Yu-Hsi D Sun
*Assistant Examiner* — Christina Sylvia
(74) *Attorney, Agent, or Firm* — Slater and Matsil, L.L.P.

(57) ABSTRACT

Packaged semiconductor devices and packaging devices and methods are disclosed. In one embodiment, a method of packaging a semiconductor device includes providing a first integrated circuit die that is coupled to a first surface of a substrate that includes through-substrate vias (TSVs) disposed therein. A conductive ball is coupled to each of the TSVs on a second surface of the substrate that is opposite the first surface of the substrate. A second integrated circuit die is coupled to the second surface of the substrate, and a molding compound is formed over the conductive balls, the second integrated circuit die, and the second surface of the substrate. The molding compound is removed from over a top surface of the conductive balls, and the top surface of the conductive balls is recessed. A redistribution layer (RDL) is formed over the top surface of the conductive balls and the molding compound.

20 Claims, 8 Drawing Sheets

PACKAGED SEMICONDUCTOR DEVICES AND PACKAGING DEVICES AND METHODS

CROSS-REFERENCE TO RELATED APPLICATIONS

This application relates to the following co-pending and commonly assigned patent application: Ser. No. 13/753,204, filed on Jan. 29, 2013, entitled, "A PoP Device," which application is hereby incorporated herein by reference.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon. Dozens or hundreds of integrated circuits are typically manufactured on a single semiconductor wafer. The individual dies are singulated by sawing the integrated circuits along a scribe line. The individual dies are then packaged separately, in multi-chip modules, or in other types of packaging, for example.

The semiconductor industry continues to improve the integration density of various electronic components (e.g., transistors, diodes, resistors, capacitors, etc.) by continual reductions in minimum feature size, which allow more components to be integrated into a given area. These smaller electronic components also require smaller packages that utilize less area than packages of the past, in some applications. 3DICs and package-on-package (PoP) devices are some recent packaging designs in which multiple dies are stacked vertically in a package.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of some of the embodiments of the present disclosure are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

Some embodiments of the present disclosure are related to packaging of semiconductor devices. Novel packaging methods, packaging devices, and packaged semiconductor devices will be described herein.

Figure 1:
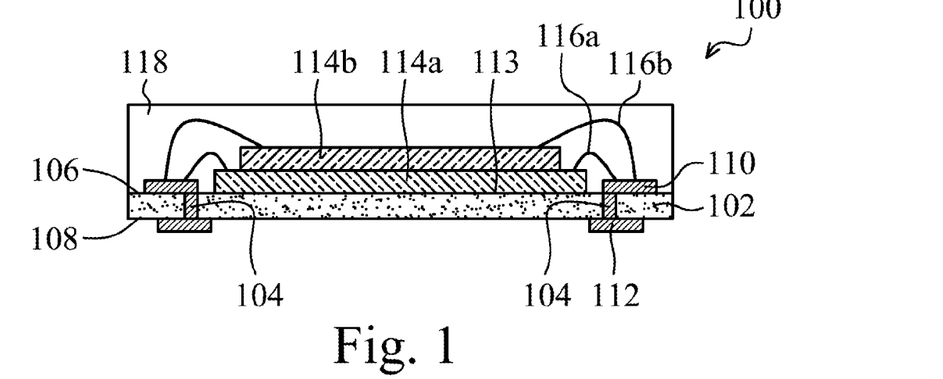
FIGS. 1 through 13 are cross-sectional views illustrating methods of packaging integrated circuit dies in accordance with some embodiments.

FIGS. 1 through 13 are cross-sectional views illustrating methods of packaging integrated circuit dies in accordance with some embodiments. Referring first to FIG. 1, a partially packaged semiconductor device 100 is provided. The partially packaged semiconductor device 100 includes one or more first integrated circuit dies 114a and 114b attached to an interposer substrate 102. The partially packaged semiconductor device 100 will be packaged with a second integrated circuit die 130 (see FIG. 4) in accordance with some embodiments.

Referring again to FIG. 1, the substrate 102 comprises a silicon substrate, a silicon or glass interposer, a printed circuit board (PCB), an organic laminate substrate, or other type of substrate, as examples. The substrate 102 includes a plurality of through substrate vias (TSVs) 104 disposed therein. The TSVs 104 extend from a first side 106 of the substrate 102 to a second side 108 of the substrate 102. The TSVs 104 comprise a conductive material and provide vertical electrical connections from the first side 106 to the second side 108 of the substrate 102. Bond pads 110 are coupled to one or more of the TSVs 104 on the first side 106 of the substrate 102, and contact pads 112 are coupled to one or more of the TSVs 104 on the second side 108 of the substrate 102.

An integrated circuit die 114a is coupled to the substrate 102 in an integrated circuit die mounting region 113 of the substrate 102. The integrated circuit die 114a may be attached to the substrate 102 using an adhesive, tape, or other means. The integrated circuit die 114a is electrically coupled to the bond pads 110 using wire bonds 116a. Integrated circuit die 114b may be attached to a top surface of integrated circuit die 114a using an adhesive, tape, or other means. The integrated circuit die 114b is electrically coupled to the bond pads 110 using wire bonds 116b. In the figures, the integrated circuit dies 114a and 114b are shown coupled to the same bond pads 110 for simplicity; however, in some embodiments, the integrated circuit dies 114a and 114b are each coupled to different bond pads 110 on the substrate 102.

The partially packaged semiconductor device 100 may include one integrated circuit die 114a in some embodiments, or the partially packaged semiconductor device 100 may include two stacked integrated circuit dies 114a and 114b that may comprise different dimensions or the same dimensions. The integrated circuit dies 114a and 114b may comprise one or more semiconductive material layers, one or more conductive material layers, one or more dielectric material layers, or combinations thereof, as examples. A molding compound 118 is formed over the vertically stacked integrated circuit dies 114a and 114b, over the wire bonds 116a and 116b, and over exposed portions of the substrate 102.

Figure 2:
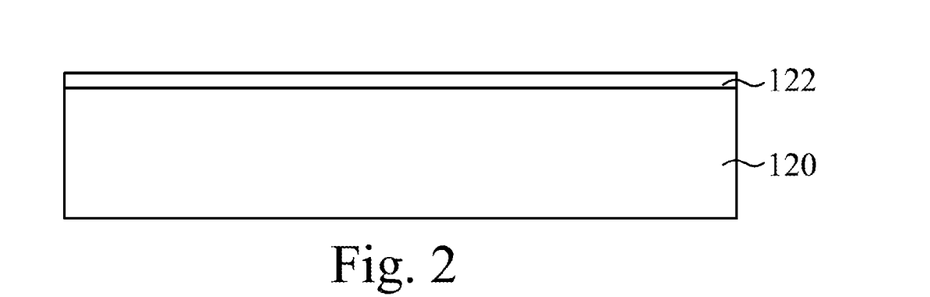
Figure 3:
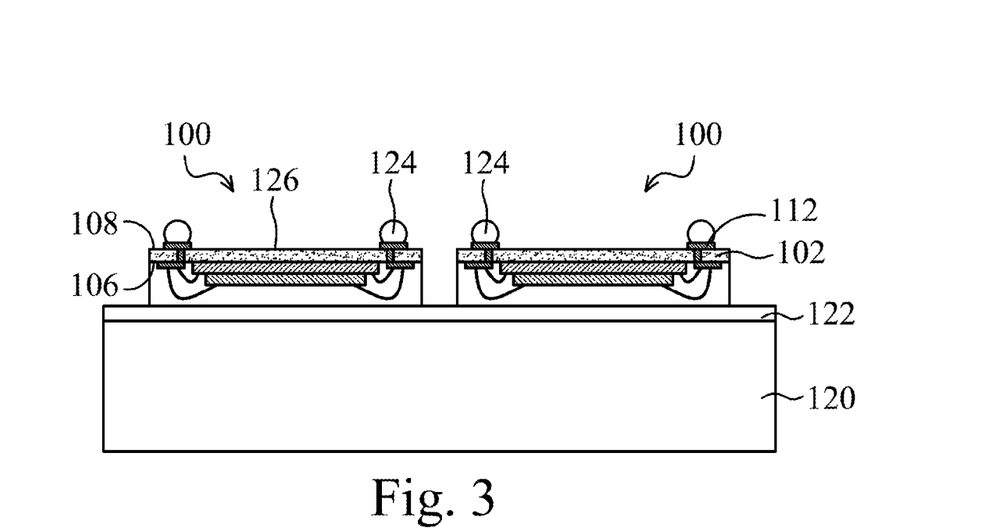

To package the partially packaged semiconductor device 100 with another integrated circuit die 130, a carrier wafer 120 is provided, as shown in FIG. 2. The carrier wafer 120 comprises a silicon substrate, a silicon or glass interposer, a PCB, or an organic laminate substrate in some embodiments. Alternatively, the carrier wafer 120 may comprise other types of wafers or materials. An adhesive 122 is applied on the carrier wafer 120. The adhesive 122 may comprise a glue, laminate coating, foil, or other types of adhesive, as examples. The partially packaged semiconductor device 100 shown in FIG. 1 (or other types of partially packaged integrated circuits) is inverted and attached to the adhesive 122 on the carrier wafer 120, as shown in FIG. 3. A plurality of the partially packaged semiconductor devices 100 are attached to the adhesive 122 on the carrier wafer 120 and processed, and after the packaging process is completed, the packaged semiconductor devices are singulated, to be described further herein.

A plurality of conductive balls 124 are attached to the contact pads 112 on the second side 108 of the substrate 102, also shown in FIG. 3. The conductive balls 124 comprise solder, Cu, or other eutectic conductive materials, for example. In some embodiments, the conductive balls 124 comprise solder, Cu, or a Cu core, as another example. The conductive balls 124 may be formed around the perimeter of the substrate 102 or along two or more sides of the substrate 102, for example. The conductive balls 124 may be formed in one or more rows around the perimeter of an integrated circuit mounting region 126 on the second side 108 of the substrate 102, for example. The conductive balls 124 may be formed in various ball grid array (BGA) arrangements, for example. Alternatively, the conductive balls 124 and contact pads 112 may be arranged in other configurations.

Figure 4:
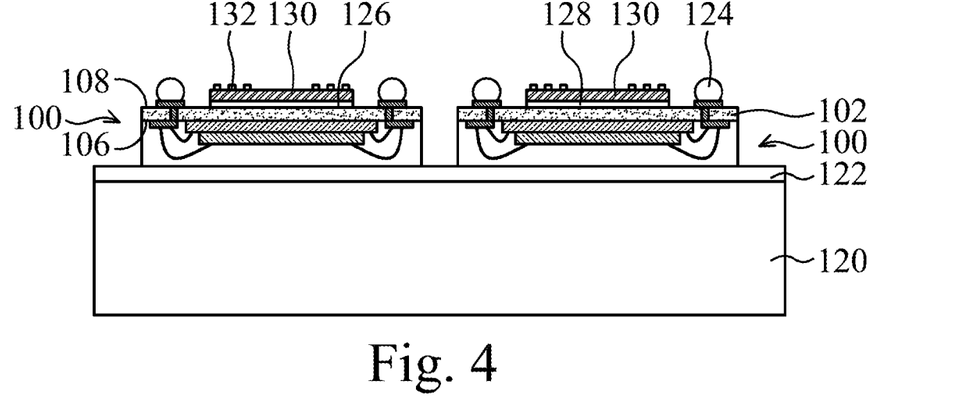

A second integrated circuit die 130 is attached to the integrated circuit die mounting region 126 of the substrate 102 using an adhesive 128, as shown in FIG. 4. The integrated circuit die 130 includes a plurality of conductive bumps 132 disposed thereon. The conductive bumps 132 may comprise solder bumps, controlled collapse chip connection (C4) bumps, Cu bumps, or other types of eutectic materials, as examples.

Figure 5:
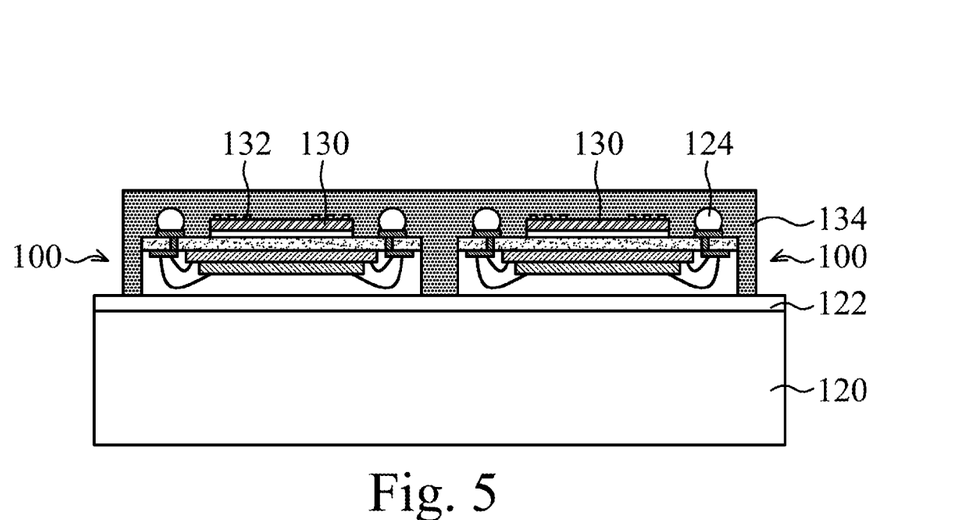

A molding compound 134 is formed over the second integrated circuit die 130, the conductive balls 124, and exposed portions of the substrate 102, as shown in FIG. 5. The molding compound 134 comprises an insulating material such as a polymer, a molding underfill material, or other insulators, as examples. The molding compound 134 is also referred to herein, e.g., in some of the claims, as a molding compound layer 134.

Figure 6:
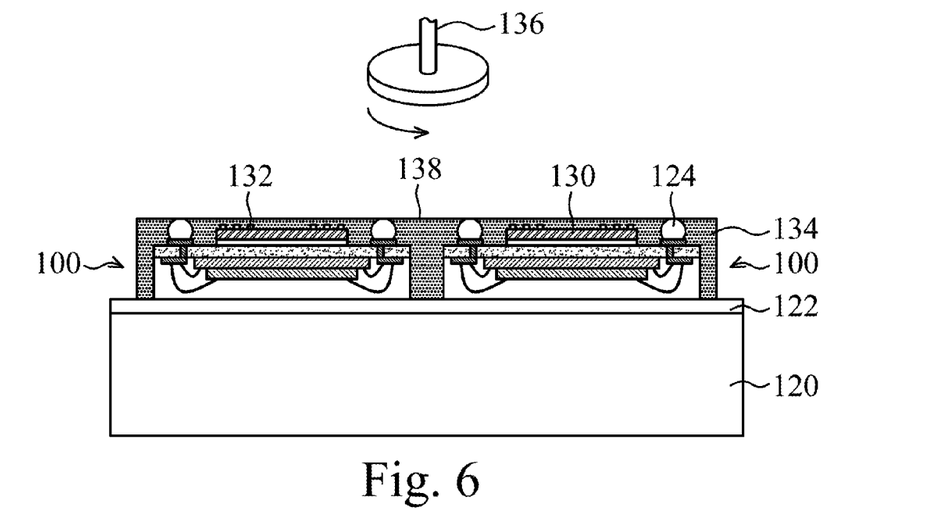

A top portion of the molding compound 134 is then removed from over top surfaces of the conductive balls 124 using a grinding process 136, as shown in FIG. 6. The grinding process 136 also results in the removal of the molding compound 134 from over top surfaces of the conductive bumps 132 on the integrated circuit die 130 in some embodiments. The grinding process 136 comprises a mechanical grinding process in some embodiments. Alternatively, other types of grinding processes 136 may be used. Removing the top portion of the molding compound 134 comprises grinding the molding compound 134 in some embodiments, for example.

The grinding process 136 may leave behind a residue 138 on a top surface of the molding compound 134, the conductive balls 124, and/or the conductive bumps 132 in some embodiments. In other embodiments, a residue 138 is not formed on the top surface of the molding compound 134 due to the grinding process 136, for example. The residue 138 may include materials of the molding compound 134, the conductive balls 124, and/or the conductive bumps 132, for example. The residue 138 may include one or more conductive and/or insulating materials, as examples. In some embodiments, at least portions of the residue comprise SnOx.

Figure 7:
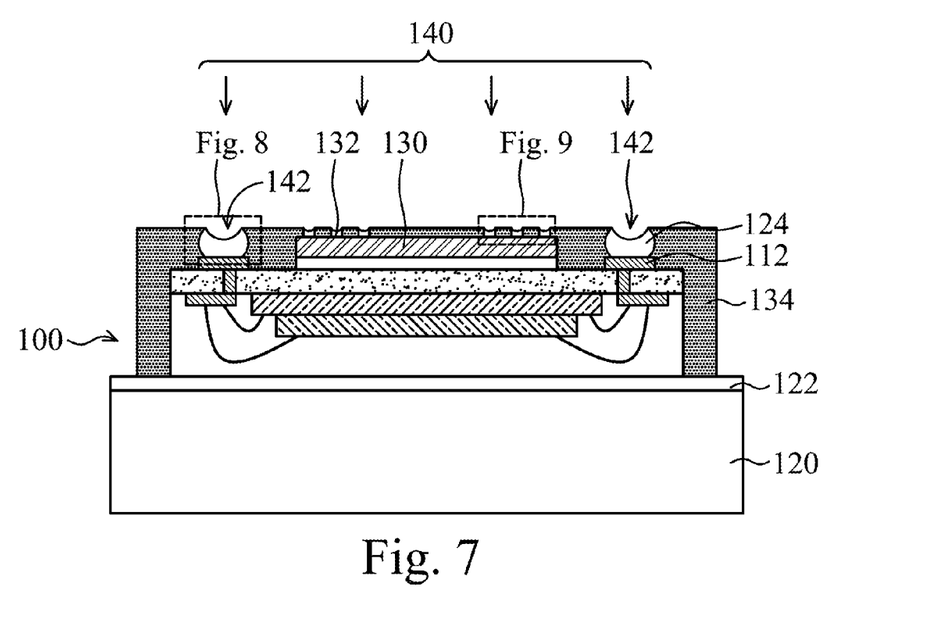

Next, a etch process 140 is used to recess the conductive balls 124, as shown in FIG. 7. Only one partially packaged semiconductor device 100 and integrated circuit die 130 are shown in FIG. 7 and the remaining drawings, to simplify the figures. The etch process 140 comprises a chemical etch process that is adapted to recess the conductive balls 124 but not recess the molding compound 134, for example. The etch process 140 comprises an etch process that selectively etches the material of the conductive balls 124 in some embodiments, for example. The etch process 140 may comprise a soft chemical etch and may comprise KOH, Formic acid, $H_2SO_4$, an HF and $HNO_3$ mixture, or an $HClO_4$ and $H_3COOH$ mixture in some embodiments, as examples, although alternatively, other types of etch chemistries may be used. The etch process 140 forms recesses 142 in the top surfaces of the conductive balls 124 in some embodiments. Recessing the top surface of the conductive balls 124 comprises etching the conductive balls 124 in some embodiments, for example.

Figure 8:
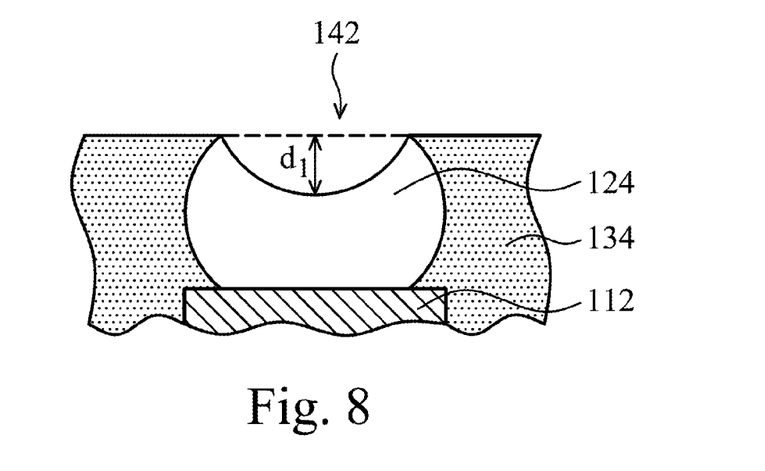

A more detailed cross-sectional view of a recess 142 formed in a conductive ball 124 is shown in FIG. 8. Recessing the top surface of the conductive balls 124 comprises recessing the top surface of the first conductive balls by a dimension $d_1$ comprising about 10 μm or less below a top surface of the molding compound 134 after the grinding process 136 in some embodiments, as an example. Alternatively, dimension $d_1$ of the recess 142 may comprise other values.

Figure 9:
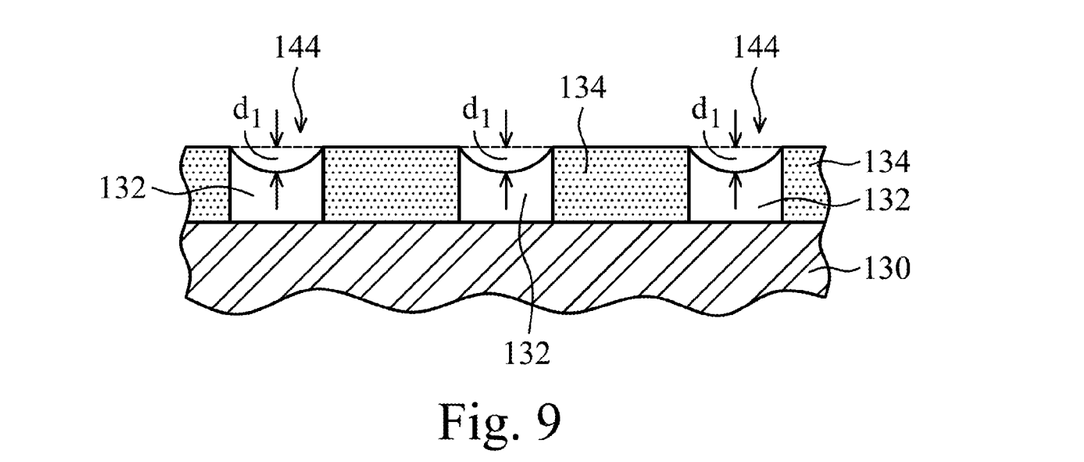

In some embodiments, the etch process 140 also results in the formation of a recess 144 in the top surfaces of the conductive bumps 132 of the integrated circuit die 130, as shown in a more detailed cross-sectional view in FIG. 9. The recesses 144 in the top surfaces of the conductive bumps 132 may comprise a dimension $d_1$ below a top surface of the molding compound 134, wherein dimension $d_1$ of the recesses 144 of the conductive bumps 132 may be substantially the same as, or different than, dimension $d_1$ of the recesses 142 of the conductive balls 124, for example. In other embodiments, the etch process 140 does not result in the formation of recesses 144 in the top surfaces of the conductive bumps 132.

In some embodiments, the etch process 140 advantageously results in the removal of the residue 138 (see FIG. 6) from the top surfaces of the molding compound 134, the conductive balls 124, and/or the conductive bumps 132. In embodiments wherein portions of the residue 138 comprise a conductive material, shorts and/or current leakage are prevented in the package by the novel etch process 140 used to form recesses 142 in the conductive balls 124 and to remove the residue 138.

Figure 10:
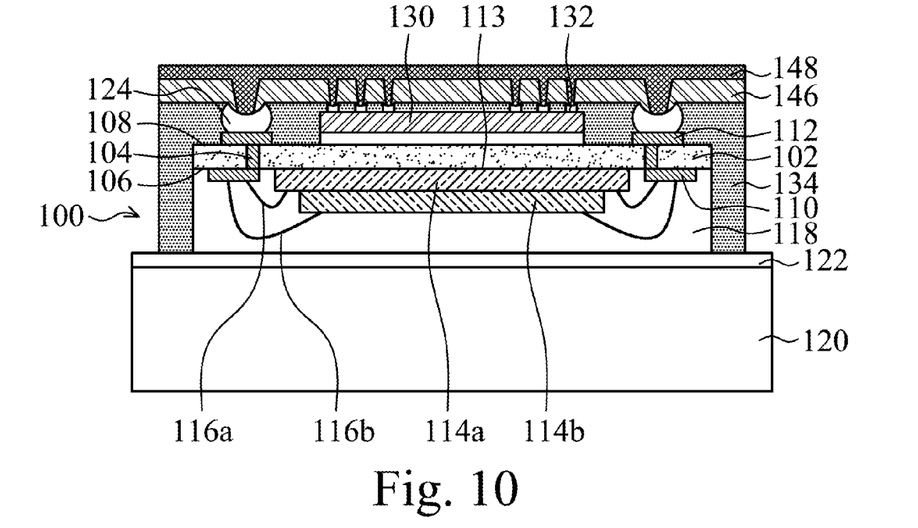
Figure 11:
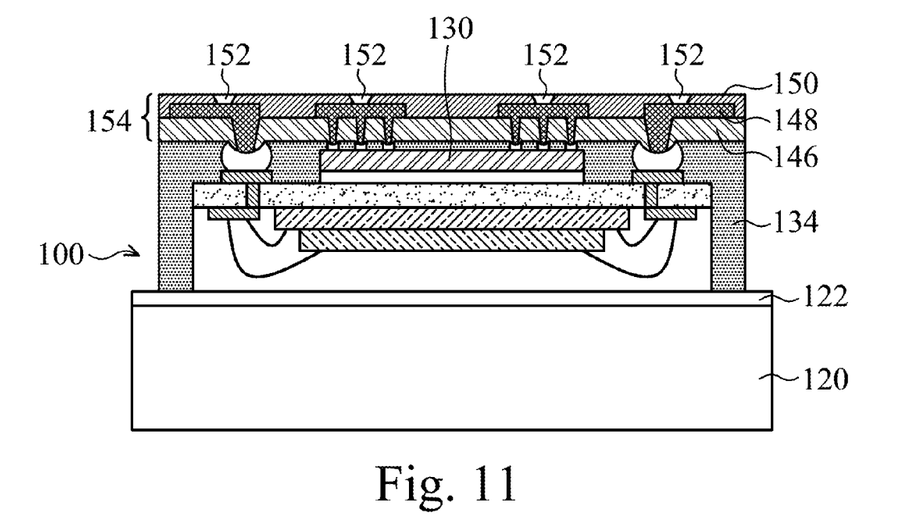

Referring next to FIGS. 10 and 11, a redistribution layer (RDL) 154 is formed over the top surface of the molding compound 134, the recessed top surfaces of the conductive balls 124, and the top surfaces of the conductive bumps 132 which may or may not be recessed in accordance with some embodiments. Forming the RDL 154 comprises coupling portions of the RDL 154 to the conductive balls 124 and/or to the conductive bumps 132 disposed on the integrated circuit die 130 in some embodiments, for example.

To form the RDL 154, a first passivation layer 146 comprising one or more insulating materials or insulating material layers is formed over the molding compound 134, the recessed top surfaces of the conductive balls 124, and the top surfaces of the conductive bumps 132, as shown in FIG. 10. The first passivation layer 146 may comprise a polymer, silicon dioxide, silicon nitride, other insulating materials, or multiple layers or combinations thereof, as examples. Alternatively, the first passivation layer 146 may comprise other materials.

The first passivation layer 146 is patterned, exposing at least portions of the top surfaces of the conductive balls 124 and the top surfaces of the conductive bumps 132. The first passivation layer 146 may be patterned using photolithography, by forming a layer of photoresist (not shown) over the first passivation layer 146, exposing the layer of photoresist to energy or light reflected from or transmitted through a lithography mask having a desired pattern thereon, developing the layer of photoresist. Exposed or unexposed regions of the layer of photoresist are ashed or etched away, depending on whether the layer of photoresist is a positive or negative photoresist, for example. The layer of photoresist is then used an etch mask while portions of the first passivation layer 146 are etched away. Alternatively, the first passivation layer 146 may be patterned using other methods, such as a direct patterning method, e.g., in embodiments wherein the first passivation layer 146 comprises a photosensitive material.

A first conductive material 148 is formed over the patterned first passivation layer 146, also shown in FIG. 10. The first conductive material 148 comprises a conductor such as Cu, Al, Ti, or combinations or multiple layers thereof, as examples. The first conductive material 148 may alternatively comprise other materials. The first conductive material 148 is patterned using photolithography into a desired pattern, as shown in FIG. 11. Portions of the first conductive material 148 remain in the patterns in the first passivation layer 146, forming contacts or vias that are electrically coupled to the top surfaces of the conductive balls 124 and conductive bumps 132. Portions of the first conductive material 148 on the top surface of the first passivation layer 146 may comprise fan-out regions that form lateral or horizontal wiring and connections of the RDL 154 in some embodiments, for example.

A second passivation layer 150 is formed over the patterned first conductive material 148 and the patterned first passivation layer 146, as shown in FIG. 11. The second passivation layer 150 may comprise similar materials described for the first passivation layer 146, for example. The second passivation layer 150 is patterned using similar methods described for the first passivation layer 146, and a second conductive material 152 is formed over the patterned second passivation layer 150. The second conductive material 152 comprises similar materials described for the first conductive material 148, for example. The second conductive material 152 is then patterned using photolithography. Portions of the second conductive material 152 comprise an under-ball metallization (UBM) structure in some embodiments, for example.

Figure 12:
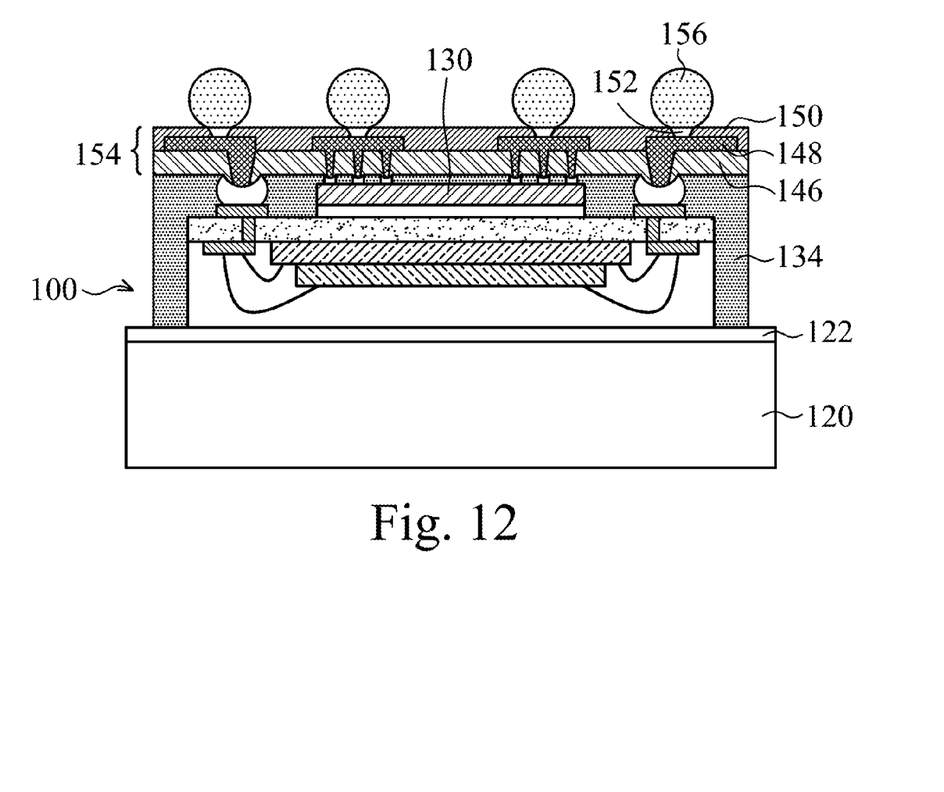

A plurality of second conductive balls 156 is formed on portions of the second conductive material 152 of the RDL 154, as shown in FIG. 12. The conductive balls 156 may be formed using a ball drop or ball mounting process, for example. The conductive balls 156 comprise solder or other eutectic material, as examples. Alternatively, the conductive balls 156 may comprise other materials and may be formed using other methods.

Figure 13:
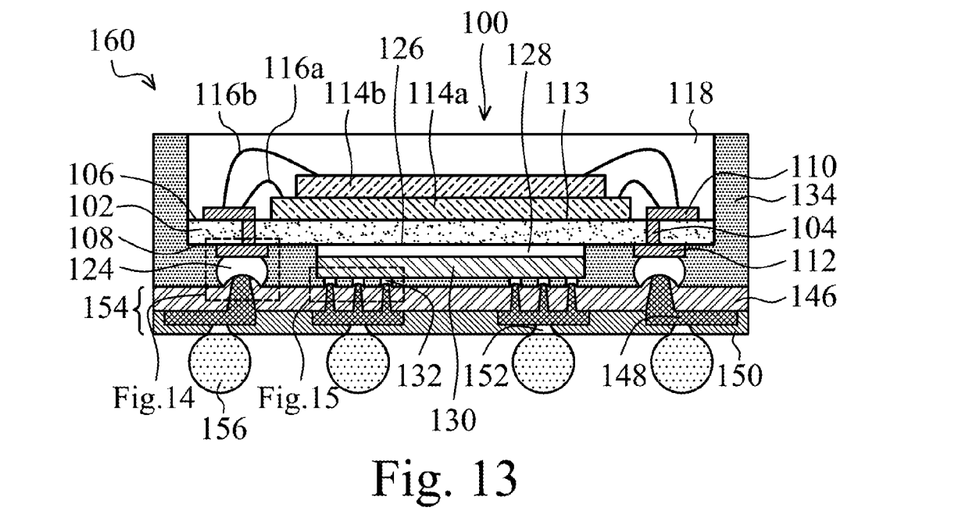

The carrier wafer 120 and adhesive 122 are then removed from the packaged semiconductor devices 160 using a debonding process, as shown in FIG. 13, which illustrates a packaged semiconductor device 160 after inverting the package. The packaged semiconductor devices 160 are singulated using a die saw or other singulation method, forming a plurality of individual packaged semiconductor devices 160. The packaged semiconductor devices 160 comprise PoP devices that each include a partially packaged semiconductor device 100 and an embedded integrated circuit die 130 coupled to the partially packaged semiconductor device 100. The RDL 154 provides fan-out regions of wiring and electrical connections for the packaged semiconductor devices 160.

Figure 14:
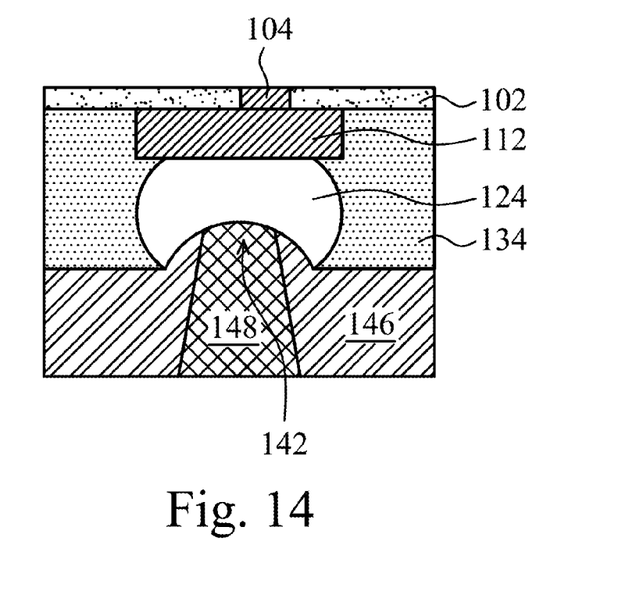
FIGS. 14 and 15 show more detailed cross-sectional views of portions of the packaged semiconductor device shown in FIG. 13.
Figure 15:
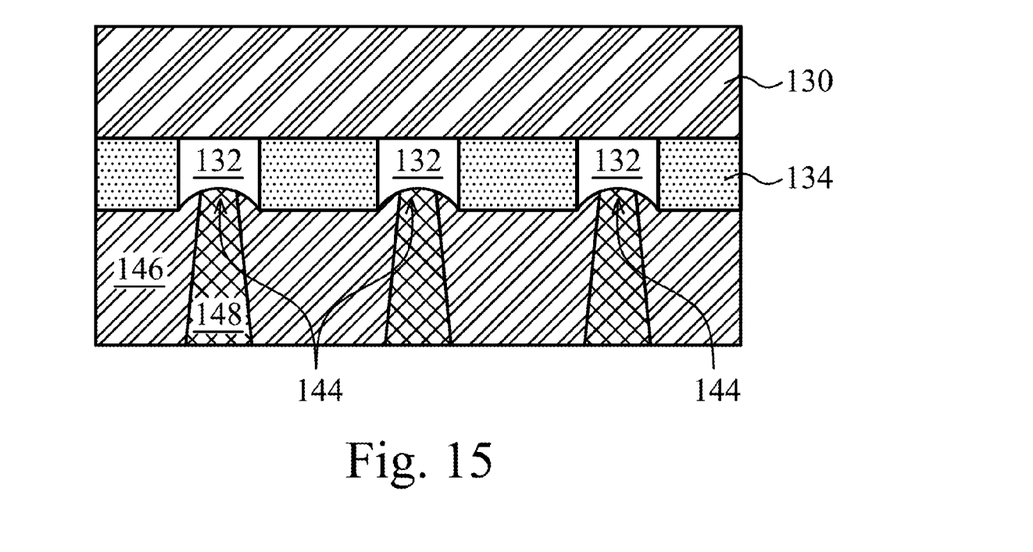

FIGS. 14 and 15 are more detailed cross-sectional views of portions of the packaged semiconductor device 160 shown in FIG. 13. FIG. 14 illustrates contacts comprised of the first conductive material 148 that are coupled to a conductive ball 124 that includes the recess 142 on the surface thereof. A portion of the first conductive material 148 fills the recess 142 in the conductive ball 124. A portion of the first passivation layer 146 also fills a portion of the recess 142 in accordance with some embodiments. The conductive ball 124 is coupled to a contact pad 112 on the substrate 102, and the contact pad 112 is coupled to a TSV 104 disposed within the substrate 102.

FIG. 15 illustrates contacts comprised of the first conductive material 148 that are coupled to conductive bumps 132 of the integrated circuit die 130 that include a recess 144 on a surface thereof. A portion of the first conductive material 148 fills the recesses 144 in the conductive bumps 132. A portion of the first passivation layer 146 also fills a portion of the recesses 144 in accordance with some embodiments. The conductive bumps 132 are disposed on the integrated circuit die 130 and are encapsulated by the molding compound 134.

The recesses 142 and 144 in the conductive balls 124 and the conductive bumps 132, respectively, are curved in a cross-sectional view in some embodiments. The recesses 142 and 144 may be deeper in a central region and shallower at edge regions, for example. Alternatively, the recesses 142 and 144 may be square or trapezoidal in a cross-sectional view, not shown in the drawings. The recesses 142 and 144 may alternatively comprise other shapes, depending on the type of etch process 140 and/or the materials of the conductive balls 124 and conductive bumps 132, for example.

In some embodiments, the conductive bumps 132 on the integrated circuit die 130 are not recessed below the surface of the molding compound 134. The conductive bumps 132 on the integrated circuit die 130 comprise top surfaces that are substantially coplanar with the top surface of the molding compound 134 in these embodiments, for example.

Figure 16:
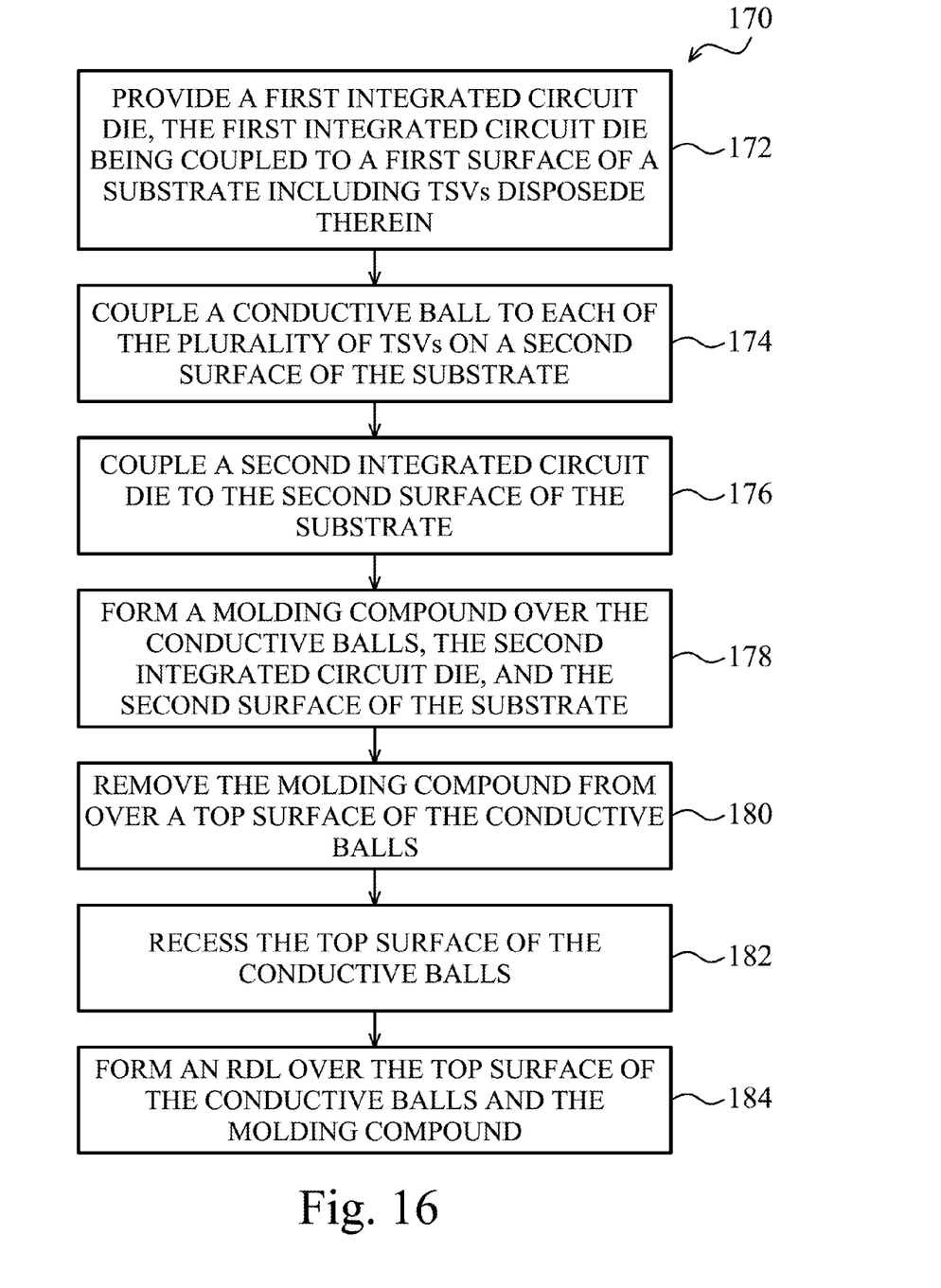
FIG. 16 is a flow chart illustrating a method of packaging a semiconductor device in accordance with some embodiments.

FIG. 16 is a flow chart 170 illustrating a method of packaging a semiconductor device in accordance with some embodiments. In step 172, a first integrated circuit die 114*a* is provided, the first integrated circuit die 114*a* being coupled to a first surface 106 of a substrate 102 including a plurality of through-substrate vias (TSVs) 104 disposed therein. In step 174, a conductive ball 124 is coupled to each of the plurality of TSVs 104 on a second surface 108 of the substrate 102, the second surface 108 being opposite the first surface 106 of the substrate 102. In step 176, a second integrated circuit die 130 is coupled to the second surface 108 of the substrate 102. In step 178, a molding compound 134 is formed over the conductive balls 124, the second integrated circuit die 130, and the second surface 108 of the substrate 102. In step 180, the molding compound 134 is removed from over a top surface of the conductive balls 124, and in step 182, the top surface of the conductive balls 124 is recessed. In step 184, an RDL 154 is formed over the top surface of the conductive balls 124 and the molding compound 134.

The integrated circuit dies 114*a*, 114*b*, and 130 described herein may include active components or circuits, not shown. The integrated circuit dies 114*a*, 114*b*, and 130 may include silicon or other types of semiconductive material with active components or circuits formed thereon, for example. The integrated circuit dies 114*a*, 114*b*, and 130 may include conductive material layers, insulating material layers, and semiconductor elements, such as transistors, diodes, capacitors, inductors, resistors, etc. In some embodiments, integrated circuit dies 114*a* and 114*b* comprise memory devices, and integrated circuit die 130 comprises a logic device or a processor, as an example. Alternatively, the integrated circuit dies 114*a*, 114*b*, and 130 may comprise other types of functional circuitry.

Some embodiments of the present disclosure include methods of packaging semiconductor devices, and also include packaged semiconductor devices 160 that have been packaged using the novel packaging methods described herein. Other embodiments include novel packaging devices.

For example, referring again to FIG. 13, in accordance with some embodiments, a packaging device includes a substrate 102 comprising TSVs 104 disposed therein. The substrate 102 includes an integrated circuit die mounting region 113 on one side 106 and an integrated circuit die mounting region 126 on the other side 108 opposite side 106. A conductive ball 124 is coupled to each of the TSVs 104, and a molding compound 134 is disposed over the substrate 102 and portions of the conductive balls 124. Top surfaces of the conductive balls 124 include a recess 142 and are recessed below a surface of the molding compound 134. An RDL 154 is disposed over the molding compound 134, and portions (e.g., portions of the first conductive material 148) of the RDL 154 are coupled to the recessed top surfaces of the conductive balls 124. In some embodiments, the substrate 102 includes a contact pad 112 coupled to each of the TSVs 104, and each conductive ball 124 is coupled to a contact pad 112.

Some embodiments of the present disclosure include packaged semiconductor devices 160 that include the packaging devices described herein. The packaged semiconductor devices 160 include an integrated circuit die 130 coupled to the surface 108 of the substrate 102 that the conductive balls 124 are coupled to. Conductive bumps 132 of the integrated circuit die 130 are coupled to portions of the RDL 154 of the packaging device. The conductive bumps 132 are also recessed below the top surface of the molding compound 134 in accordance with some embodiments. In some embodiments, the packaged semiconductor device 160 also includes integrated circuit die 114a and/or 114b coupled to a surface 106 of the substrate 102.

Advantages of some embodiments of the disclosure include providing novel packaging methods and devices wherein a novel etch process 140 is used to remove a residue 138 formed by a grinding process 136 for a molding compound 134, which prevents and/or reduces shorts and current leakage between integrated circuit dies 114a, 114b, and 130. Improved adhesion of the first passivation layer 146 of the RDL 154 to the molding compound 134 is achieved due to the removal of the residue 138. Portions of the residue 138 may contain SnOx, and the etch process 140 advantageously removes the SnOx, resulting in an improved conductive interface surface on the conductive balls 124 and conductive bumps 132.

A thermal budget for the molding compound 134 can be reduced, avoiding the need for a high curing temperature for the molding compound 134, due to the implementation of the etch process 140, which reduces warpage of the package. For example, a high temperature curing temperature process which would avoid the residue becoming easily trapped within a soft molding compound (which has not been high temperature cured) during a CMP process is avoided by the implementation of the etch process 140 of embodiments of the present disclosure.

Only one substrate 102 is required, and the integrated circuit die 130 is embedded in the packaging system without requiring an additional interposer substrate, for example. A low cost 3D packaging system is disclosed that has a novel fan-out interconnect structure. Furthermore, the novel packaging devices and methods are easily implementable in manufacturing and packaging process flows.

In accordance with some embodiments of the present disclosure, a method of packaging a semiconductor device includes providing a first integrated circuit die that is coupled to a first surface of a substrate that includes TSVs disposed therein. A conductive ball is coupled to each of the TSVs on a second surface of the substrate that is opposite the first surface of the substrate. A second integrated circuit die is coupled to the second surface of the substrate, and a molding compound is formed over the conductive balls, the second integrated circuit die, and the second surface of the substrate. The molding compound is removed from over a top surface of the conductive balls, and the top surface of the conductive balls is recessed. An RDL is formed over the top surface of the conductive balls and the molding compound.

In accordance with other embodiments, a method of packaging a semiconductor device includes attaching a first integrated circuit die to a carrier wafer, wherein the first integrated circuit die is coupled to a substrate. The substrate includes a plurality of TSVs disposed therein and includes a first surface and a second surface opposite the first surface. The first integrated circuit is coupled to the first surface of the substrate, and the plurality of TSVs extend from the first surface to the second surface of the substrate. The method includes coupling a first conductive ball to each of the plurality of TSVs on the second surface of the substrate, coupling a second integrated circuit die to the second surface of the substrate, and forming a molding compound layer over the first conductive balls, the second integrated circuit die, and the second surface of the substrate. The method includes grinding the molding compound layer to expose a top surface of the first conductive balls, recessing the top surface of the first conductive balls, and forming a RDL over the top surface of the first conductive balls and a top surface of the molding compound layer. A plurality of second conductive balls is formed over the RDL, and the carrier wafer is removed.

In accordance with other embodiments, a packaging device includes a substrate comprising a plurality of TSVs disposed therein, and a conductive ball coupled to each of the plurality of TSVs. A molding compound layer is disposed over the substrate and portions of the conductive balls, wherein top surfaces of the conductive balls are recessed below a top surface of the molding compound layer. An RDL is disposed over the molding compound layer. Portions of the RDL are coupled to the recessed top surfaces of the conductive balls.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of packaging a semiconductor device, the method comprising:

providing a first integrated circuit die, the first integrated circuit die being coupled to a first surface of a substrate including a plurality of through-substrate vias (TSVs) disposed therein;

coupling a conductive ball to each of the plurality of TSVs on a second surface of the substrate, the second surface being opposite the first surface of the substrate;

coupling a second integrated circuit die to the second surface of the substrate;

forming a molding compound over the conductive balls, the second integrated circuit die, and the second surface of the substrate;

removing the molding compound from over a top surface of the conductive balls;

recessing the top surface of the conductive balls; and forming a redistribution layer (RDL) over the top surface of the conductive balls and the molding compound.

2. The method according to claim 1, wherein removing the molding compound from over the top surface of the conductive balls further comprises removing the molding compound from over a top surface of conductive bumps disposed on the second integrated circuit die.

3. The method according to claim 2, wherein recessing the top surface of the conductive balls further comprises recessing the top surface of the conductive bumps disposed on the second integrated circuit die.

4. The method according to claim 2, wherein forming the RDL comprises coupling portions of the RDL to the conductive bumps disposed on the second integrated circuit die.

5. The method according to claim 1, wherein recessing the top surface of the conductive balls comprises etching the conductive balls.

6. The method according to claim 1, wherein removing the molding compound comprises grinding the molding compound.

7. The method according to claim 1, wherein forming the RDL comprises coupling portions of the RDL to the conductive balls.

8. A method of packaging a semiconductor device, the method comprising:

attaching a first integrated circuit die to a carrier wafer, wherein the first integrated circuit die is coupled to a substrate, the substrate including a plurality of through-substrate vias (TSVs) disposed therein, the substrate including a first surface and a second surface opposite the first surface, wherein the first integrated circuit is coupled to the first surface of the substrate, wherein the plurality of TSVs extend from the first surface to the second surface of the substrate;

coupling a first conductive ball to each of the plurality of TSVs on the second surface of the substrate;

coupling a second integrated circuit die to the second surface of the substrate;

forming a molding compound layer over the first conductive balls, the second integrated circuit die, and the second surface of the substrate;

grinding the molding compound layer to expose a top surface of the first conductive balls;

recessing the top surface of the first conductive balls;

forming a redistribution layer (RDL) over the top surface of the first conductive balls and a top surface of the molding compound layer;

forming a plurality of second conductive balls over the RDL; and removing the carrier wafer.

9. The method according to claim 8, wherein recessing the top surface of the first conductive balls comprises recessing the top surface of the first conductive balls by about 10 μm or less.

10. The method according to claim 8, wherein grinding the molding compound layer comprises mechanically grinding the molding compound layer.

11. The method according to claim 8, wherein grinding the molding compound layer leaves a residue on a top surface of the molding compound layer and the top surface of the first conductive balls.

12. The method according to claim 11, wherein recessing the top surface of the conductive balls comprises a chemical etch process, and wherein the chemical etch process removes the residue from the top surface of the molding compound layer and the top surface of the first conductive balls.

13. The method according to claim 8, wherein grinding the molding compound layer exposes a top surface of a plurality of conductive bumps disposed on the second integrated circuit die, and wherein forming the RDL comprises:

forming a first passivation layer over the top surface of the first conductive balls, the molding compound layer, and the plurality of conductive bumps;

patterning the first passivation layer, exposing the top surface of the first conductive balls and the top surface of the plurality of conductive bumps;

forming a first conductive material over the first passivation layer, the top surface of the first conductive balls and the top surface of the plurality of conductive bumps;

patterning the first conductive material;

forming a second passivation layer over the patterned first conductive material and the first passivation layer;

patterning the second passivation layer;

forming a second conductive material over the patterned second passivation layer; and patterning the second conductive material.

14. The method according to claim 13, wherein forming the first conductive material and patterning the first conductive material comprise forming contacts and fan-out regions of the RDL, wherein forming the second conductive material and patterning the second conductive material comprise forming an under-ball metallization (UBM) structure, and wherein forming the plurality of second conductive balls over the RDL comprises coupling the plurality of second conductive balls to the UBM structure.

15. A method of packaging a semiconductor device, comprising:

forming a plurality of through-substrate vias (TSVs) through a substrate;

mounting the substrate to a carrier wafer;

coupling a respective conductive ball to each of the plurality of TSVs;

attaching an integrated circuit die to the substrate, the integrated circuit die having conductive bumps formed thereon;

at least partially encapsulating the conductive bumps, and the conductive balls, in a molding compound, the molding compound having a top surface;

recessing the respective top surfaces of the conductive balls below the top surface of the molding compound; and electrically contacting respective recessed top surfaces of the conductive balls.

16. The method according to claim 15, further comprising attaching a second integrated circuit die to a surface of the substrate opposite the surface of the substrate upon which is mounted the integrated circuit die.

17. The method according to claim 16, wherein the second integrated circuit die includes at least one electrical contact coupled to at least one of the plurality of TSVs through a wire bond.

18. The method according to claim 16, further comprising coupling to respective portions of the RDL respective ones of a plurality of electrical connectors, wherein the second integrated circuit die is electrically connected to at least one of the plurality of electrical connectors.

19. The method according to claim 15, wherein the conductive balls and the conductive bumps are fully encapsulated by the molding compound, and further comprising:
   removing a portion of the molding compound to expose top surfaces of the conductive balls.

20. The method according to claim 15, wherein the step of electrically contacting respective recessed top surfaces of the conductive balls includes forming a redistribution layer (RDL) over the molding compound layer and coupling respective portions of the RDL to respective recessed top surfaces of the conductive balls.

\* \* \* \* \*